US 6,671,449 B1

(12) United States Patent
Yuan et al.

(10) Patent No.: US 6,671,449 B1
(45) Date of Patent: Dec. 30, 2003

(54) OPTICAL PACKAGING ASSEMBLY INCLUDING A HERMETICALLY SEALED OPTICAL DEVICE HOUSING AND METHOD OF MAKING THE SAME

(75) Inventors: Bin Yuan, San Jose, CA (US); Doug Baney, Los Altos, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/171,213

(22) Filed: Jun. 13, 2002

(51) Int. Cl.[7] ............................. G02B 6/00; G02B 6/36; H02R 33/945
(52) U.S. Cl. ........................ 385/135; 385/92; 439/577
(58) Field of Search ........................... 385/135, 92, 93, 385/94; 257/680, 683, 698; 439/577

(56) References Cited

U.S. PATENT DOCUMENTS

| 5,412,748 | A | 5/1995 | Furuyama et al. | |
|---|---|---|---|---|
| 5,815,616 | A | 9/1998 | Bishop et al. | |
| 6,216,939 | B1 | 4/2001 | Thackara | |
| 6,295,154 | B1 | 9/2001 | Laor et al. | |
| 6,296,400 | B1 | * 10/2001 | Uchiyama et al. | 385/94 |
| 6,381,255 | B1 | * 4/2002 | Van Saarloos et al. | 372/9 |
| 6,384,473 | B1 | 5/2002 | Peterson et al. | |
| 2002/0071460 | A1 | * 6/2002 | Goldberg et al. | 372/36 |
| 2002/0136505 | A1 | * 9/2002 | Goldberg et al. | 385/92 |

* cited by examiner

Primary Examiner—Chandrika Prasad

(57) ABSTRACT

Optical packaging assemblies and methods of making the same are described. In one aspect, an optical packaging assembly includes a package housing, a hermetically sealed optical device housing, and an optical fiber alignment assembly. The package housing includes an optical fiber feedthrough and a package electric feedthrough. One or more optical fibers extend through the optical fiber feedthrough. The hermetically sealed optical device housing is mounted within the package housing and includes an optical window and a device electric feedthrough that is electrically connected to the electric feedthrough of the package housing. At least one optical device is mounted within the hermetically sealed optical device housing in optical alignment with respect to the optical window. The optical fiber alignment assembly is mounted within the package housing and holds end portions of the one or more optical fibers in alignment for optical communication through the window of the hermetically sealed optical device housing.

20 Claims, 5 Drawing Sheets

OPTICAL PACKAGING ASSEMBLY INCLUDING A HERMETICALLY SEALED OPTICAL DEVICE HOUSING AND METHOD OF MAKING THE SAME

TECHNICAL FIELD

This invention relates to optical packaging assemblies and methods of making the same.

BACKGROUND

Optical devices typically are packaged in hermetically sealed or plastic molded packages to prevent environmental degradation that otherwise might be caused by, for example, humidity, contaminants, and electrically charged species. Hermetic sealing typically involves mounting an optical device within a metal or ceramic package and enclosing the optical device within the package by soldering, welding, or brazing a cover or lid to the package. The package may include a hermetically sealed electric feedthrough assembly and a hermetically sealed window that allow electrical and optical communication with the enclosed optical device.

Some optical device packages may include hermetically sealed optical fiber feedthroughs, enabling optical fiber communication with the optical devices. In some approaches an optical fiber is fed through a hole in one of the metal walls of an optical device package. Excess solder is applied in a molten state outside the hole to form a solder body surrounding and adhering to the optical fiber. During cooling the molten solder shrinks and the free surface of the solder body also shrinks under the influence of surface tension. The solder is drawn towards the hole and onto and around the glass fiber, thus hermetically sealing in the fiber. In another approach, at least one optical fiber and at least one solder preform is placed between the sealing surface of a package lid and the sealing surface of a package housing; the assembly then is sealed by applying pressure and heat so as to press the fiber (or fibers) into the solder (see U.S. Pat. No. 6,216,939). Commonly, an array of optical fibers is needed, rather than a single fiber. In general, package manufacturing complexity and cost increases with the number of fibers because each optical fiber requires a respective hermetical feedthrough.

SUMMARY

The invention features optical packaging schemes that enable the tasks of hermetically sealing optical devices against environmental degradation and aligning the optical devices with optical fibers to be separated. In this way, the invention satisfies the need to protect optical devices against environmental damage while avoiding the costs and complexity associated with hermetically sealed optical fiber arrangements.

In one aspect of the invention, an optical packaging assembly includes a package housing, a hermetically sealed optical device housing, and an optical fiber alignment assembly. The package housing includes an optical fiber feedthrough and a package electric feedthrough. One or more optical fibers extend through the optical fiber feedthrough. The hermetically sealed optical device housing is mounted within the package housing and includes an optical window and a device electric feedthrough that is electrically connected to the electric feedthrough of the package housing. At least one optical device is mounted within the hermetically sealed optical device housing in optical alignment with respect to the optical window. The optical fiber alignment assembly is mounted within the package housing and holds end portions of the one or more optical fibers in alignment for optical communication through the window of the hermetically sealed optical device housing.

In another aspect, the invention features a method of making the above-described optical packaging assembly.

Other features and advantages of the invention will become apparent from the following description, including the drawings and the claims.

DETAILED DESCRIPTION

In the following description, like reference numbers are used to identify like elements. Furthermore, the drawings are intended to illustrate major features of exemplary embodiments in a diagrammatic manner. The drawings are not intended to depict every feature of actual embodiments nor relative dimensions of the depicted elements, and are not drawn to scale.

Figure 1:
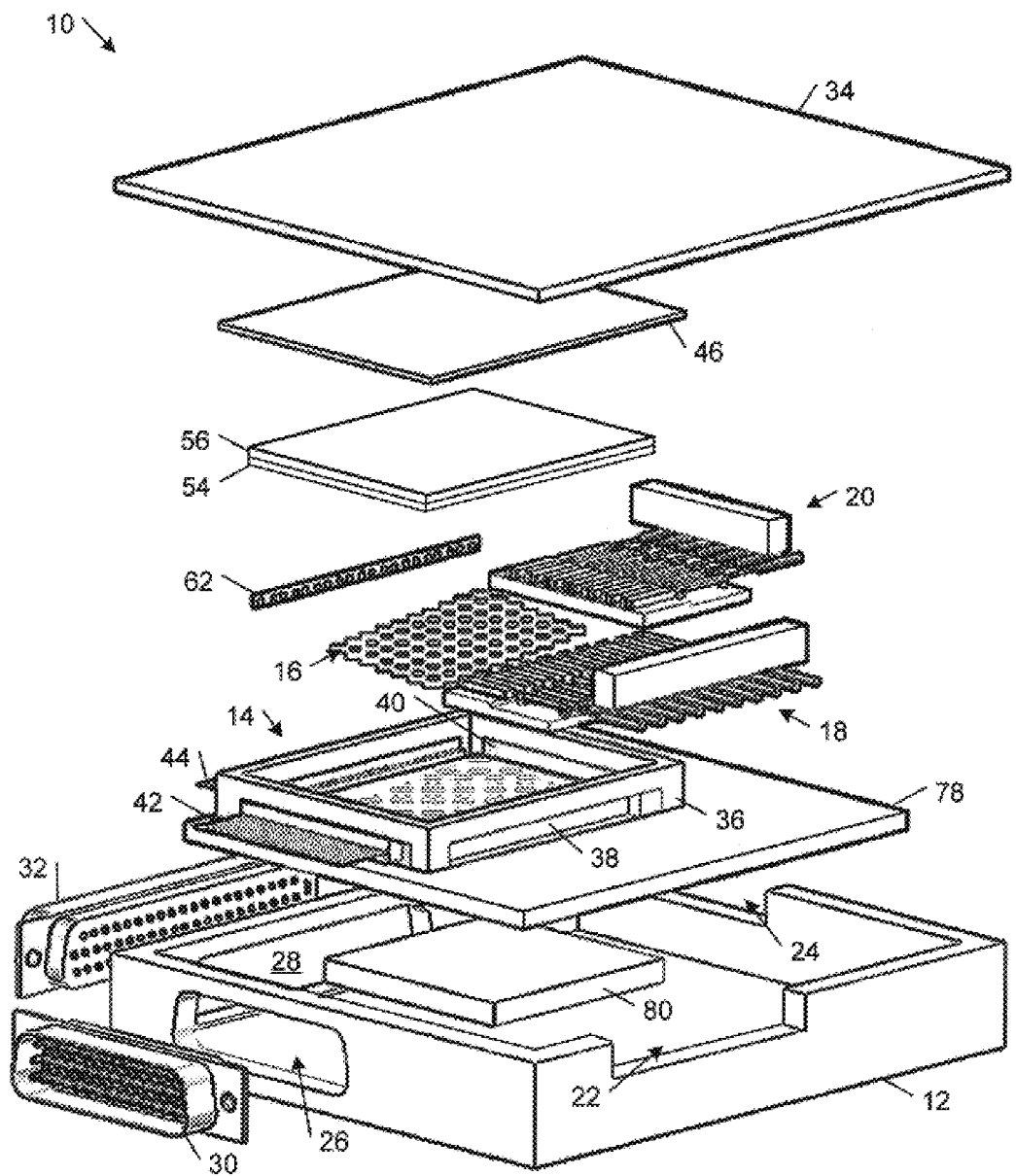
FIG. 1 is a diagrammatic exploded view of an optical packaging assembly.

Referring to FIGS. 1, 2, 3, 4, 5, 6 and 7, an initially to FIG. 1, in some embodiments, an optical packaging assembly 10 includes a package housing 12, a hermetically sealable optical device housing 14, an optical device assembly 16 that includes at least one optical device and is mounted within optical device housing 14, and a pair of optical fiber alignment assemblies 18, 20.

Package housing 12 may be formed from any conventional opto-electronic device package material, including a ceramic, a metal, and a plastic material. Package housing 12 includes a pair of optical fiber feedthroughs 22, 24 that are designed to accommodate respective sets of one or more optical fibers, and a pair of electric feedthroughs 26, 28 that are designed to accommodate respective electric connectors 30, 32. In some embodiments, the optical fiber and electric feedthroughs 22–28 are not hermetically sealed; in other embodiments, however, the optical fiber and electric feedthroughs 22–28 are hermetically sealed. In non-hermetically sealed embodiments, package housing 12 is enclosed by a cover 34 that may be attached to package housing 12 by a standard sealing material (e.g., a rubber-based sealant).

Figure 2:
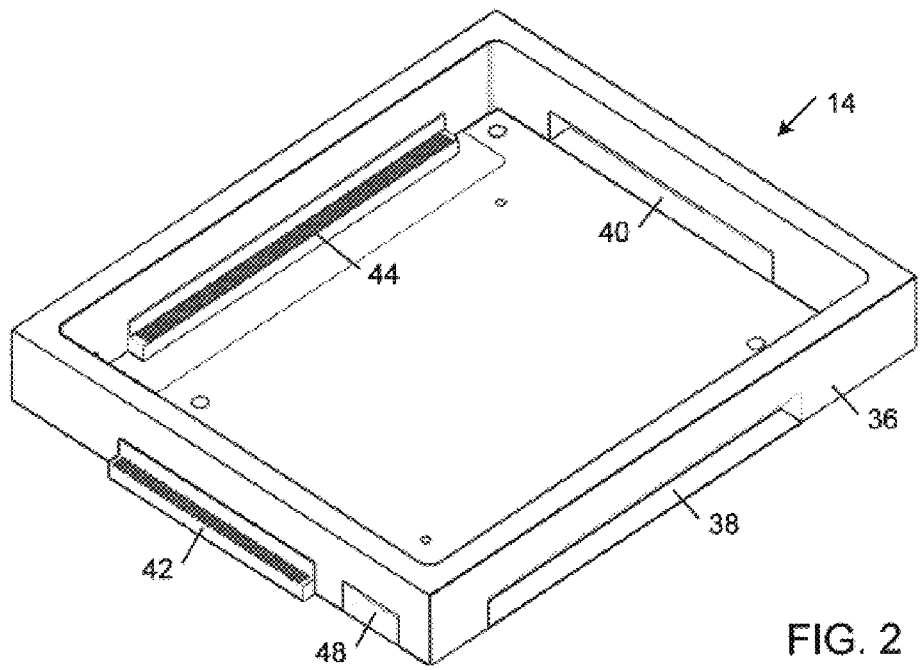
FIG. 2 is a diagrammatic perspective view of a hermetically sealable optical device housing.

Referring to FIGS. 1 and 2, optical device housing 14 includes a window frame 36 that may be formed from any one of a wide variety of different hermetically sealable package materials, including an iron-nickel-cobalt alloy (e.g., Kovar®, available from Carpenter Technology Corporation of Wyomissing, Pa., U.S.A.), and a composite ferrous metal (e.g., Silvar®, available from Texas Instruments Inc. of Dallas, Tex. U.S.A.). In one embodiment, window frame 36 is formed from Silvar®-K with a coefficient of thermal expansion of about 7.0. Window frame 36 includes a pair of openings that are designed to accommodate a pair of windows 38, 40 that are characterized by a coefficient of thermal expansion that is substantially matched to the coefficient of thermal expansion of window frame 36. Windows 38, 40 are substantially transparent to the optical signals transmitted to or from (or both) the one or more optical devices of optical device assembly 16. In one embodiment, windows 38, 40 are formed from BK7 borosilicate crown glass with a coefficient of thermal expansion of about 7.1 and high optical transmittance down to about 350 nm (available from Schott Glass Technologies Inc. of Duryea, Pa., U.S.A.). Window frame 36 also includes a pair of openings that are designed to accommodate a pair of electric feedthroughs 42, 44 that are characterized by a coefficient of thermal expansion that is substantially matched to the coefficient of thermal expansion of window frame 36. In one embodiment, electric feedthroughs 42, 44 are formed from alumina ceramic (96% $Al_2O_3$) with a coefficient of thermal expansion of about 7.1. Electric feedthroughs 42, 44 may be formed in accordance with a standard electric feedthrough interface protocol. Optical device housing 14 is enclosed by a cover 46. Cover 46, windows 38, 40, and electric feedthroughs 42, 44 may be attached to window frame 36 by a standard hermetical sealing process, which may involve, for example, soldering, welding, or brazing. As shown in FIG. 2, in some embodiments, window frame 36 may include an opening that is designed to accommodate an optical alignment window 48, which may be used to align optical device housing 14 with respect to optical fiber alignment assemblies 18, 20.

Figure 3:
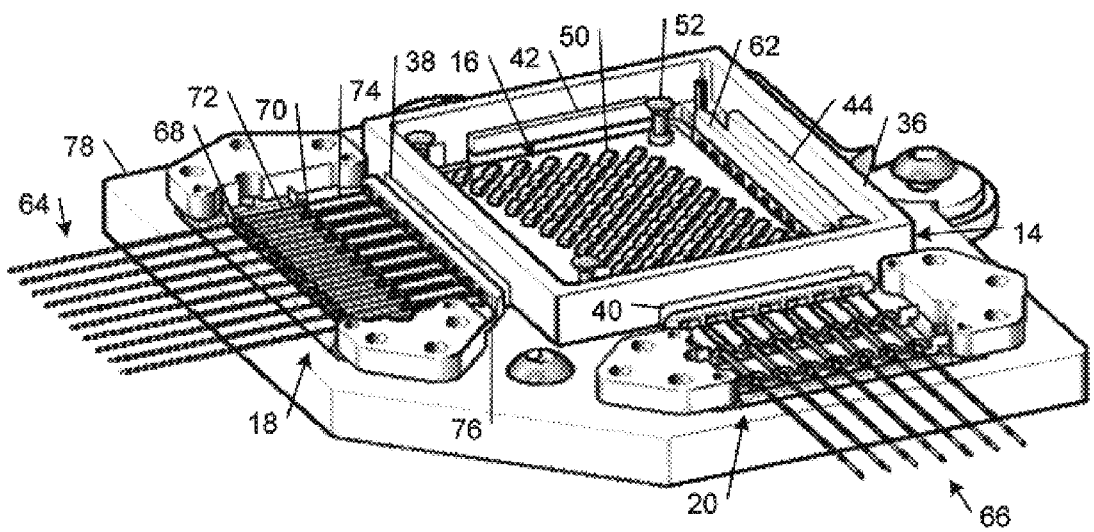
FIG. 3 is a diagrammatic perspective view of an optical device assembly that is mounted within the hermetically sealable optical device housing of FIG. 2.
Figure 4:
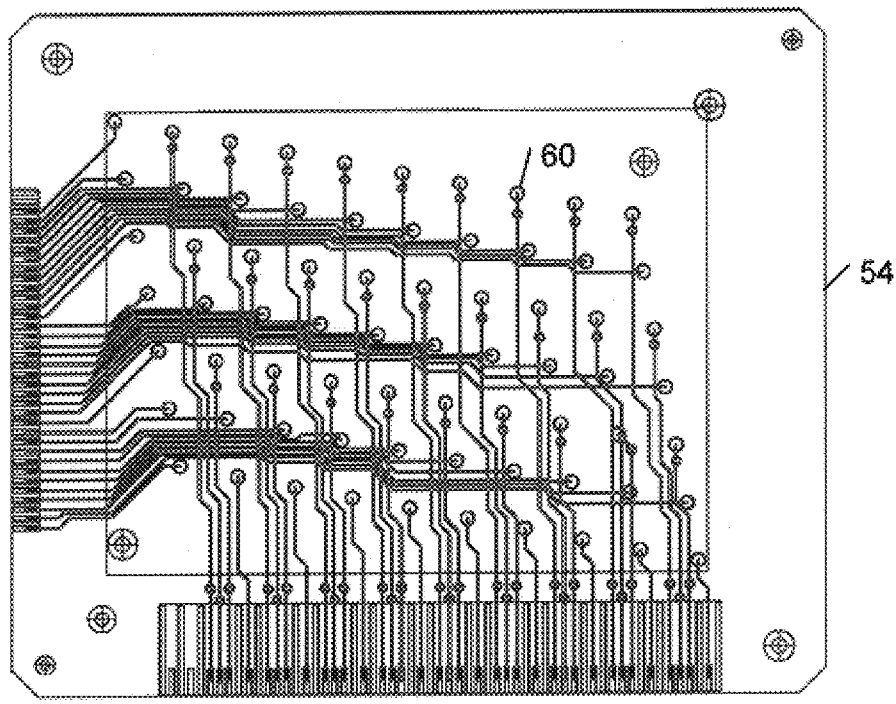
FIG. 4 is a diagrammatic top view of a printed circuit board.
Figure 5:
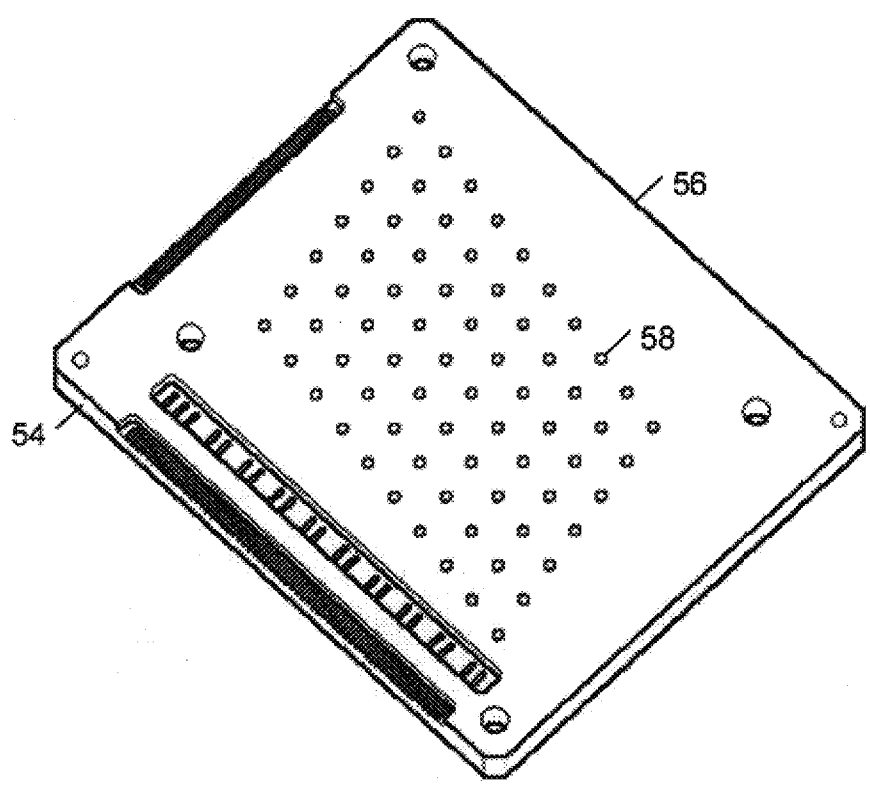
FIG. 5 is a diagrammatic perspective view of an interposer connected to the printed circuit board of FIG. 4.

Referring to FIGS. 1 and 3, the one or more optical devices of optical device assembly 16 may be implemented in the form of any one of a wide variety of known optical devices that are operable to communicate with one or more respective optical fibers through one or more of windows 38, 40. As shown in FIG. 3, in the illustrated embodiment, the optical devices of optical device assembly 16 are implemented in the form of optical switches 50 that are operable to direct signals carried by a first set 64 of optical fibers selectively to a second set 66 of optical fibers. A set of screws 52 may be used to mount optical device assembly 16 within optical device housing 14.

Figure 6:
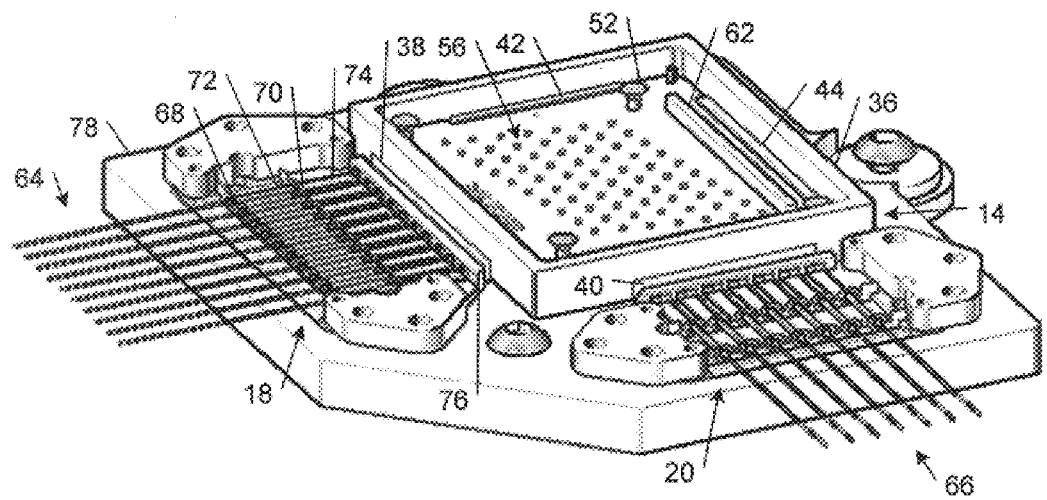
FIG. 6 is a diagrammatic perspective view of the interposer/printed circuit board assembly of FIG. 5 mounted on top of the optical device shown in FIG. 3 within the hermetically sealable optical device housing of FIG. 2.
Figure 7:
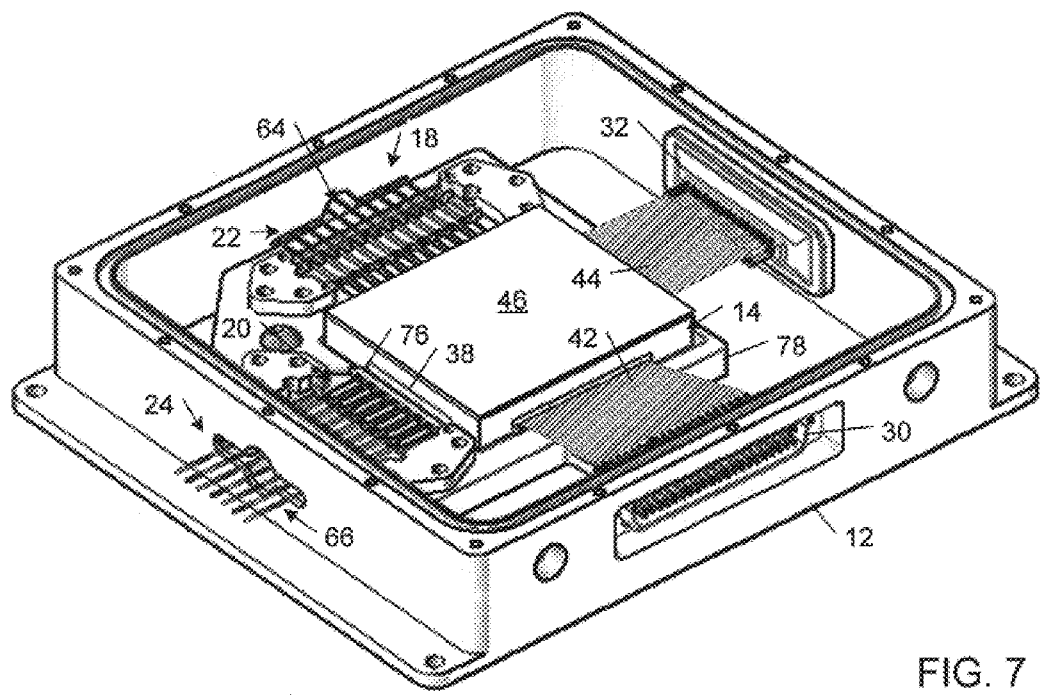
FIG. 7 is a diagrammatic perspective view of the optical device housing of FIG. 6 after being hermetically sealed and mounted within a package housing that includes two optical fiber feedthroughs and two electric feedthroughs.

Referring to FIGS. 1, 4, 5 and 6, in addition to optical device assembly 16, optical device housing 14 also includes a printed circuit board 54 and an interposer 56. Printed circuit board 54 carries integrated circuits and other devices for controlling the operation of the one or more optical devices of optical device assembly 16. Interposer 56 is configured to electrically connect printed circuit board 54 to electric feedthroughs 42, 44. In one embodiment, interposer 56 includes a plurality of Fuzz Button® electrical contacts 58 (available from Tecknit USA of Cranford, N.J., U.S.A.) that are arranged in a pattern matching the arrangement of corresponding electrical contacts 60 on printed circuit board 54. As shown in FIG. 6, printed circuit board 54 and interposer 56 may be mounted within optical device housing 14 by mounting screws 52.

Referring to FIGS. 1, 3 and 6, in addition to optical device assembly 16, printed circuit board 54 and interposer 56, optical device housing 14 also may include a photodetector array 62. Photodetector array 62 includes a respective photodetector for each optical fiber in at least one set 64, 66 of optical fibers respectively held in place by optical fiber alignment assemblies 18, 20. Each photodetector is constructed and arranged to perform optical signal measurements (e.g., power loss measurements) within optical device housing 14 and to transmit those measurements electrically through electric feedthrough 44.

Referring to FIGS. 1, 3, 6 and 7, optical fiber alignment assemblies 18, 20 are configured to hold end portions of respective sets 64, 66 of one or more optical fibers respectively extending through optical fiber feedthroughs 22, 24 of package housing 12. The optical fiber end portions are held in optical alignment for optical communication through windows 38, 40. In particular, each optical fiber end portion is held in place by a respective pair of fiber guide rings 68, 70, which are disposed on opposite sides of a respective collimator 72. Each collimator 72 is disposed adjacent to a respective walkoff correction crystal 74. Each walkoff correction crystal 74, in turn, is disposed adjacent to a conventional half-wave plate 76. In the illustrated embodiment, optical fiber alignment assemblies 18, 20 and window frame 36 are mounted on a common support platform 78. Support platform 78 may be formed from any material that may be hermetically sealed to window frame 36 and that has an appropriately matched coefficient of thermal expansion. In one embodiment, support platform 78 is formed from an alloy containing 15% Cu and 85% Mo by weight. In the illustrated embodiment, support platform 78 is mounted on a conventional thermo-electric cooler 80 within package housing 12.

Figure 8:
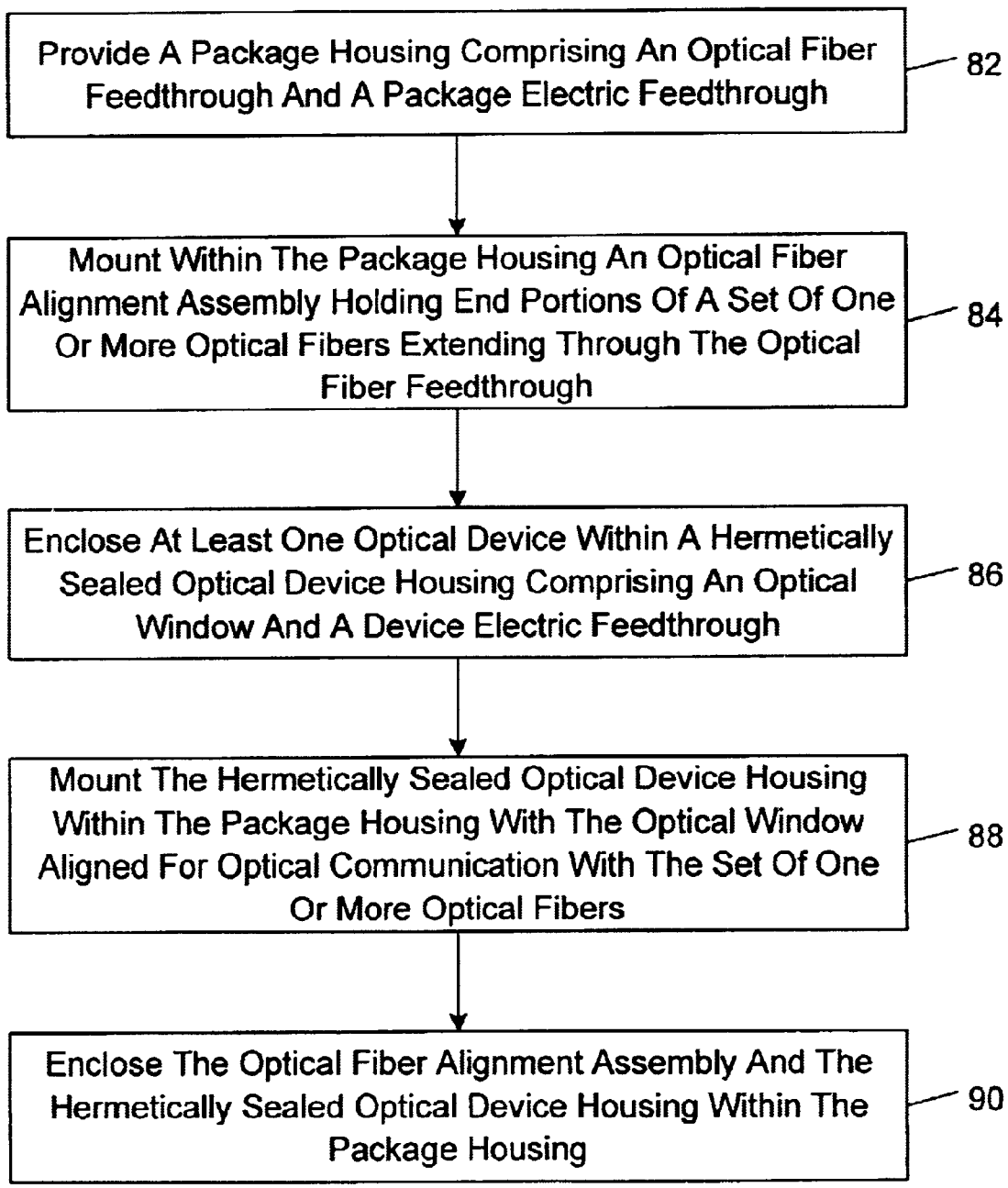
FIG. 8 is a flow diagram of a method of making the optical packaging assembly of FIG. 1.

Referring to FIG. 8, in some embodiments, optical packaging assembly 10 may be fabricated as follows. Initially, a package housing 12 that includes a pair of optical fiber feedthroughs 22, 24 and a pair of package electric feedthroughs 26, 28 is provided (step 82). A pair of optical fiber alignment assemblies 18, 20 each holding end portions of respective sets of one or more optical fibers extending through the optical fiber feedthrough 22, 24 are mounted within the package housing 12 (step 84). An optical device assembly 16 that includes at least one optical device is enclosed within a hermetically sealed optical device housing 14 that includes a pair of optical windows 38, 40 and a pair of device electric feedthroughs 42, 44 (step 86). The optical device housing 14 is hermetically sealed by a low-temperature (e.g., on the order of 80° C. or less) soldering, welding or brazing process. The hermetically sealed optical device housing 14 is mounted within package housing 12 with the optical windows 38, 40 aligned for optical communication with the sets of one or more optical fibers (step 88). For example, in some embodiments, the hermetically sealed optical device housing 14 is mounted together with optical fiber alignment assemblies 18, 20 on a common substrate 78. Before optical device housing 14 is fixed to substrate 78, however, optical device housing 14 is aligned optically with respect to optical fiber alignment assemblies 18, 20 using a standard optical alignment process. The optical device housing 14 may be mounted on substrate 78 by epoxy or a low-temperature solder. The resulting assembly of optical device housing 14 and optical fiber alignment assemblies 18, 20 then may be mounted within the package housing 12. The optical fiber alignment assemblies 18, 20 and the hermetically sealed optical device housing 14 then are enclosed within the package housing 12 (step 90).

Other embodiments are within the scope of the claims.

What is claimed is:

1. An optical packaging assembly, comprising:
   a package housing comprising an optical fiber feedthrough and a package electric feedthrough including a package electric connector;
   a set of one or more optical fibers extending through the optical fiber feedthrough;
   a hermetically sealed optical device housing mounted within the package housing and comprising an optical window and a device electric feedthrough electrically connected to the package electric connector;
   at least one optical device mounted within the hermetically sealed optical device housing in optical alignment with respect to the optical window; and
   an optical fiber alignment assembly mounted within the package housing and holding end portions of the or more optical fibers in alignment for optical communication through the window of the hermetically sealed optical device housing.

2. The optical packaging assembly of claim 1, wherein the optical fiber feedthrough is configured to accommodate an array of optical fibers.

3. The optical packaging assembly of claim 2, wherein the optical fiber alignment assembly is configured to hold end portions of the optical fibers in a fiber plane substantially perpendicular to the optical window.

4. The optical packaging assembly of claim 3, wherein the optical window is elongated along a dimension substantially parallel to the fiber plane.

5. The optical packaging assembly of claim 4, wherein the optical window has a rectangular shape.

6. The optical packaging assembly of claim 1, wherein the optical device housing and the optical window have substantially matching coefficients of thermal expansion.

7. The optical packaging assembly of claim 1, wherein the optical device housing further comprises an optical alignment window.

8. The optical packaging assembly of claim 1, wherein the package housing comprises a second optical fiber feedthrough.

9. The optical packaging assembly of claim 8, further comprising a second optical fiber alignment assembly holding end portions of a second set of one or more optical fibers extending through the second optical fiber feedthrough.

10. The optical packaging assembly of claim 9, wherein the hermetically sealed optical device housing comprises a second optical window aligned for optical communication with the second set of optical fibers.

11. The optical packaging assembly of claim 9, wherein the end portions of the optical fibers respectively held in place by the first and second optical fiber alignment assemblies are oriented in substantially perpendicular directions.

12. The optical packaging assembly of claim 11, wherein the optical device is an optical switch operable to direct signals carried by the optical fibers of the first set selectively to the optical fibers of the second set.

13. The optical packaging assembly of claim 1, wherein the optical fiber alignment assembly comprises a respective collimator for each of the one or more optical fibers.

14. The optical packaging assembly of claim 1, wherein the optical fiber alignment assembly comprises a respective walkoff correction crystal for each of the one or more optical fibers.

15. The optical packaging assembly of claim 1, wherein the hermetically sealed optical device housing and the optical fiber alignment assembly are mounted on a common support platform within the package housing.

16. The optical packaging assembly of claim 15, wherein the support platform is mounted on a thermoelectric cooler within the package housing.

17. The optical packaging assembly of claim 1, further comprising a respective photodetector for each of the set of one or more optical fibers, each photodetector being mounted within the hermetically sealed optical device housing in optical alignment with a respective optical fiber.

18. A method of making an optical packaging assembly, comprising:
   providing a package housing comprising an optical fiber feedthrough and a package electric feedthrough;
   mounting within the package housing an optical fiber alignment assembly holding end portions of a set of one or more optical fibers extending through the optical fiber feedthrough;
   enclosing at least one optical device within a hermetically sealed optical device housing comprising an optical window and a device electric feedthrough;
   mounting the hermetically sealed optical device housing within the package housing with the optical window aligned for optical communication with the set of one or more optical fibers;
   enclosing the optical fiber alignment assembly and the hermetically sealed optical device housing within the package housing.

19. The method of claim 18, wherein the package housing comprises a second optical fiber feedthrough, and further comprising mounting within the package housing a second optical fiber alignment assembly holding end portions of a second set of one or more optical fibers extending through the second optical fiber feedthrough.

20. The method of claim 18, further comprising enclosing within the hermetically sealed optical device housing a respective photodetector for each of the set of one or more optical fibers, each photodetector being mounted within the hermetically sealed optical device housing in optical alignment with a respective optical fiber.

* * * * *